United States Patent
Alton

(10) Patent No.: US 11,736,084 B2
(45) Date of Patent: Aug. 22, 2023

(54) TUNABLE ELECTRICAL COMPONENT HAVING DISTRIBUTED-ELEMENT CIRCUIT

(71) Applicant: Knowles Cazenovia, Inc., Cazenovia, NY (US)

(72) Inventor: Gregory Alton, Cazenovia, NY (US)

(73) Assignee: Knowles Cazenovia, Inc., Cazenovia, NY (US)

( * ) Notice: Subject to any disclaimer, the term of this patent is extended or adjusted under 35 U.S.C. 154(b) by 224 days.

(21) Appl. No.: 17/358,394

(22) Filed: Jun. 25, 2021

(65) Prior Publication Data
US 2022/0416747 A1  Dec. 29, 2022

(51) Int. Cl.
*H03H 7/01* (2006.01)
*H03H 1/00* (2006.01)

(52) U.S. Cl.
CPC ........ *H03H 7/0153* (2013.01); *H03H 1/0007* (2013.01)

(58) Field of Classification Search
CPC .......... H03H 7/00; H03H 7/01; H03H 7/0107; H03H 7/0123; H03H 7/0153; H03H 1/0007
USPC .................................................. 333/185, 186
See application file for complete search history.

(56) References Cited

U.S. PATENT DOCUMENTS

| | | | |
|---|---|---|---|
| 6,356,170 B1 * | 3/2002 | Arakawa | H01P 1/2056 333/248 |
| 7,449,980 B2 | 11/2008 | Bates | |
| 7,663,454 B2 | 2/2010 | Bates | |
| 7,956,708 B2 | 6/2011 | Bates et al. | |
| 9,490,768 B2 | 11/2016 | Randall et al. | |
| 9,887,446 B2 * | 2/2018 | Yosui | H01P 1/203 |
| 10,547,096 B2 | 1/2020 | Bates | |
| 10,770,776 B2 | 9/2020 | Bates | |
| 2020/0021004 A1 | 1/2020 | Bates | |
| 2020/0021030 A1 | 1/2020 | Bates | |
| 2020/0259263 A1 | 8/2020 | Dani | |
| 2020/0358160 A1 | 11/2020 | Alton | |
| 2020/0403286 A1 | 12/2020 | Burdick | |
| 2021/0167478 A1 | 6/2021 | Nadeau | |

OTHER PUBLICATIONS

Burdick et al., U.S. Appl. No. 17/013,504, U.S. Patent and Trademark Office, Sep. 4, 2020.
New Scale Technology, Data Sheet for M3-L Linear Actuator, Smart Module for Precision Motion, Aug. 30, 2017.

* cited by examiner

*Primary Examiner* — Hai L Nguyen
(74) *Attorney, Agent, or Firm* — Loppnow & Chapa

(57) ABSTRACT

The disclosure relates to an electrical component, for example, a surface-mount resonator, including a distributed-element circuit disposed on a dielectric base and separated from an electromagnetic field modification member by a gaseous gap, wherein a frequency characteristic of the electrical component can be tuned by positioning the electromagnetic field modification member relative to the distributed-element circuit using an actuator.

20 Claims, 7 Drawing Sheets

TUNABLE ELECTRICAL COMPONENT HAVING DISTRIBUTED-ELEMENT CIRCUIT

FIELD OF THE DISCLOSURE

The present disclosure relates generally to distributed-element circuit electrical components and more particularly to tunable distributed-element transmission line circuit electrical components, for example, tunable surface-mount ceramic filters.

BACKGROUND

The demand for high efficiency, small footprint, and low cost electrical components in communications, radar, and electronic warfare systems, among other radio frequency (RF) and microwave applications in the commercial, military and other sectors has grown exponentially. One such electrical component commonly used in these and other applications is a surface-mount filter having a conductive microstrip patterned on a dielectric substrate that separates the micros trip from a ground plane. A microstrip is a form of a distributed-element transmission line circuit that is typically used to convey RF frequencies higher than about 100-500 MHz including microwave frequencies. The electrical characteristics of such components are generally a function of the micros trip geometry. However, existing surface-mount filters and other distributed-element circuit components have fixed electrical characteristics that cannot be tuned after manufacture.

BRIEF DESCRIPTION OF THE DRAWINGS

The objects, features and advantages of the present disclosure will become more fully apparent from the following Detailed Description and the appended Claims considered in conjunction with the accompanying drawings. The drawings depict only representative embodiments and are therefore not considered to limit the scope of the disclosure.

Those of ordinary skill in the art will appreciate that the figures are illustrated for simplicity and clarity and therefore may not be drawn to scale and may not include well-known features, that the order of occurrence of actions or steps may be different than the order described and that the actions or steps may be performed concurrently unless the Description indicates, and that the terms and expressions used herein have the meaning understood by those of ordinary skill in the art except where different meanings are attributed to them herein.

DETAILED DESCRIPTION

The present disclosure relates generally to electrical components having distributed-element circuits and more particularly to electrical components having distributed-element circuits with tunable electrical characteristics. Such components include for example tunable surface-mount resonators, filters, couplers and power dividers among other components. Representative examples are described herein.

Figure 1:
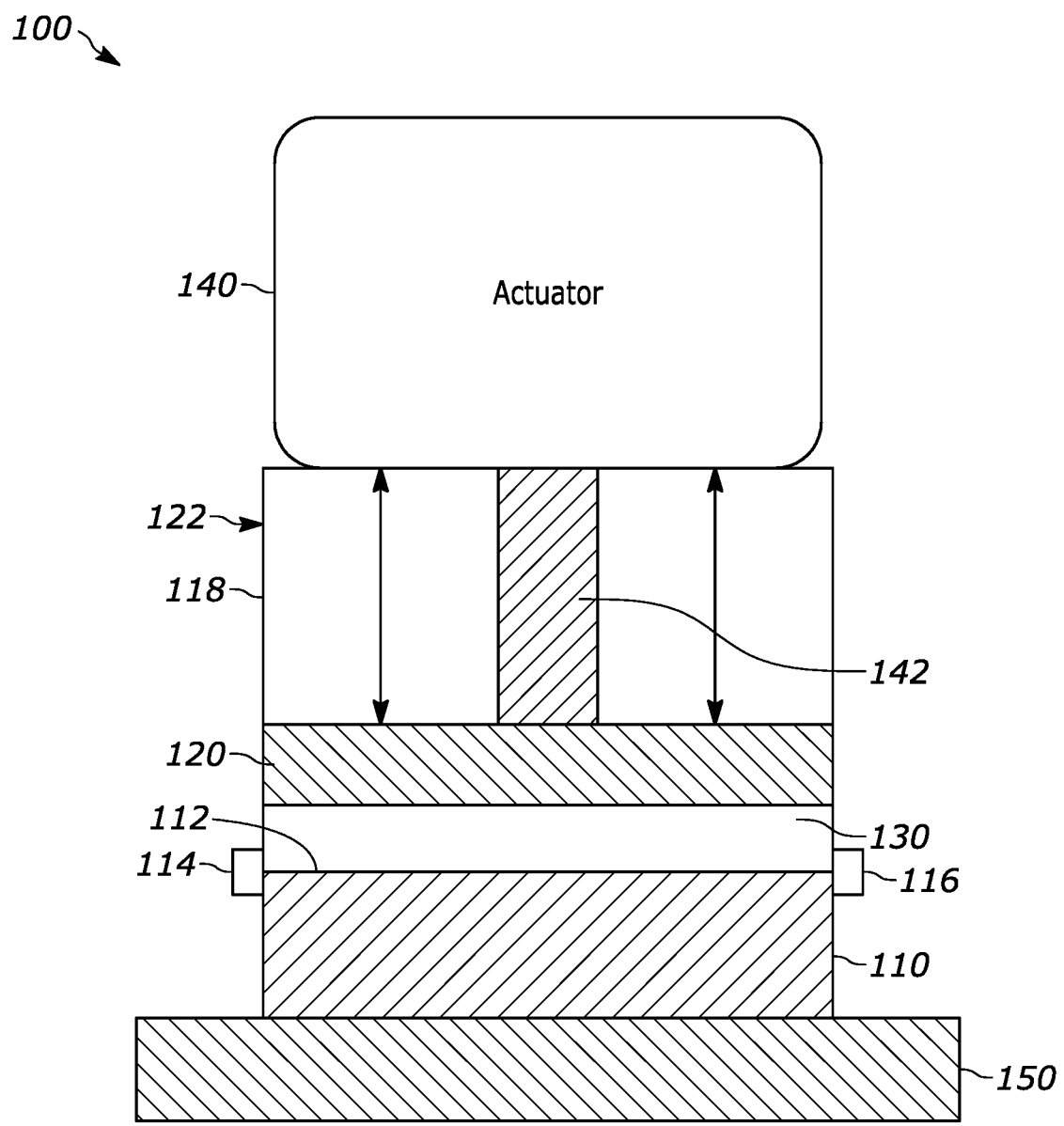
FIG. 1 is a sectional end view of a tunable surface-mount electrical component having a distributed-element circuit.

In FIG. 1, a representative electrical component 100 generally comprises a dielectric base 110 supporting a conductive distributed-element circuit on a surface 112 thereof. The distributed-element circuit is configured as a conductive transmission line on the dielectric base. An electromagnetic field modification member 120 is separated from the distributed-element circuit by a gap 130, and an actuator 140 including a movable member is coupled to the electromagnetic field modification member, wherein the electromagnetic field modification member is positionable relative to the distributed-element circuit upon actuation of the movable member. The gap can be a gas like air, a fluid or some other material having a dielectric that differs from the dielectric base.

The electromagnetic field modification member is configured and positionable to influence or effect the electromagnetic field generated by the distributed-element circuit based on the proximity of the modification member to all or one or more portions of the distributed-element circuit. For example, a frequency or other characteristic of the electrical component is adjustable by positioning the electromagnetic field modification member relative to the distributed-element circuit. In FIG. 1, the electromagnetic field modification member is a substrate having a planar surface oriented substantially parallel to the dielectric base on which the transmission line is disposed. Other surface geometries and orientations are also possible. For example, the relative sizes of the dielectric base and the field modification member can be different, and the field modification member need not be parallel to the surface on which the transmission line is disposed, among other variations. The electromagnetic field modification member can be a dielectric, a conductor or a combination dielectric and conductor. In some implementations, the field modification member includes a ground plane located on either side or within a dielectric. The ground plane can be frictionally contact a conductor coupled to electrical ground as the gap is adjusted by the actuator. The conductor can be fixed to an inner housing wall or other structure. Alternatively, the ground plane of the field modification member can be coupled to a flexible wire that permits adjustment by the actuator.

The dielectric base is an insulating substrate that can be a ceramic formed by sintering or some other process, among other known and future dielectric materials, including air. The distributed-element circuit can comprise a conductive ink or other conductive material deposited on or applied to the insulating substrate by a thin film, thick film, printing, or by some other known or future fabrication process.

Figure 2:
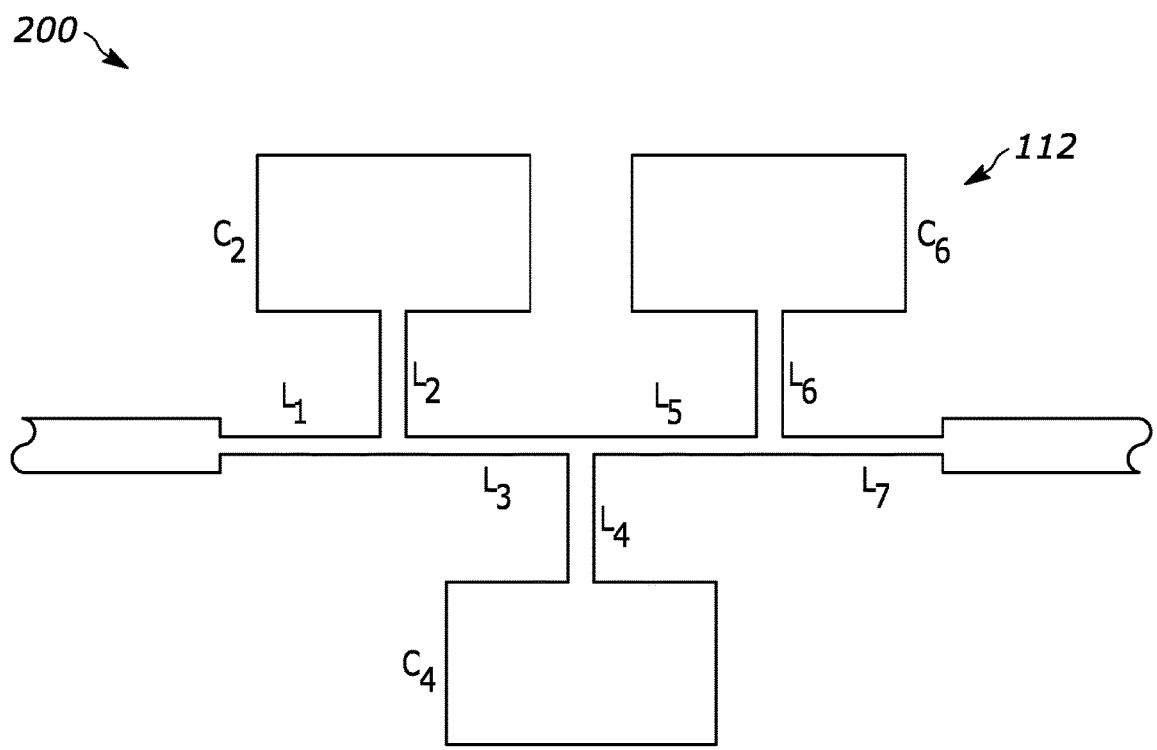
FIG. 2 is a plan view of a distributed-element filter circuit.
Figure 3:
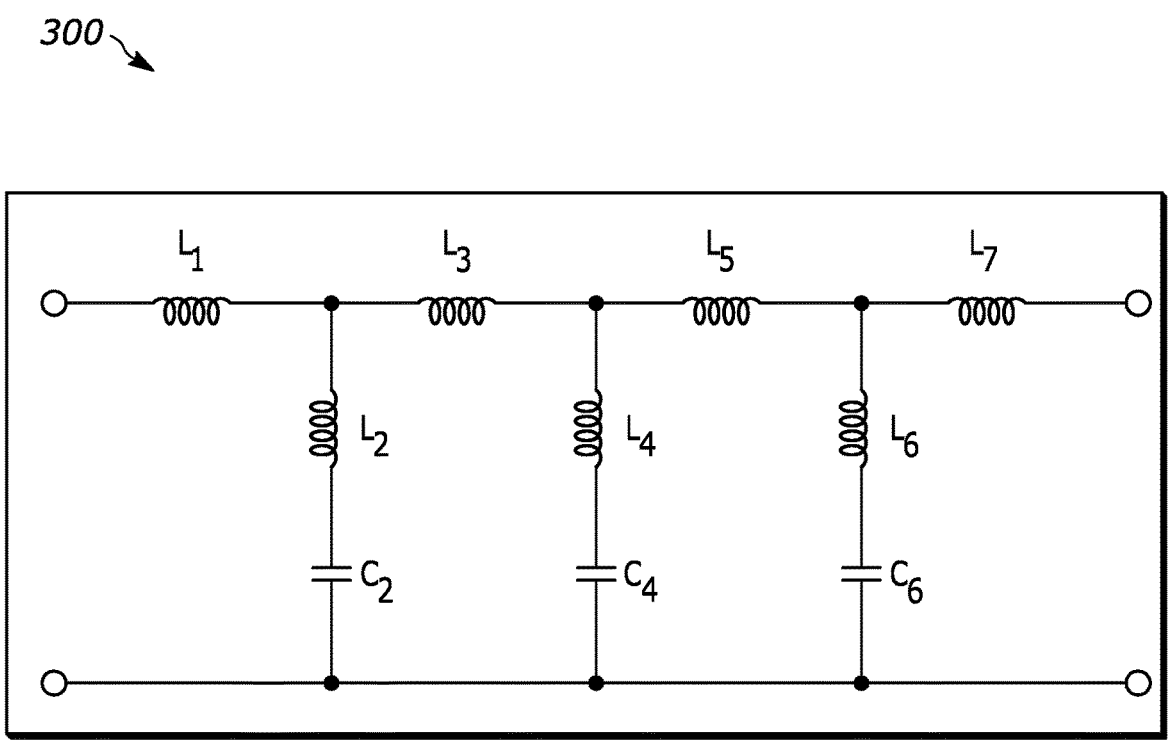
FIG. 3 is a lumped-element circuit equivalent to the distributed-element circuit of FIG. 2.

In FIG. 2, a representative distributed-element circuit 200 comprises a plurality of resonators comprising capacitive elements $C_N$ and inductive elements $L_N$ that constitute a filter disposed on an insulating surface, for example the surface 112 of the dielectric base 110 in FIG. 1. FIG. 3 is an equivalent lumped-element circuit schematic 300 for the distributed-element filter circuit 200 of FIG. 2. Various other electrical components, examples of which are described herein, can also be fabricated as a transmission line on a dielectric base as described herein. Characteristics of the filter shown in FIG. 2 or other distributed-element circuit can be tuned by adjusting a position of the electromagnetic field modification member relative to the transmission line or portions thereof using the actuator as described further herein. Representative filter characteristics include center frequency, bandwidth (BW), cutoff frequency, insertion loss, return loss and group delay, among others. Other circuit components may have other characteristics.

Figure 4:
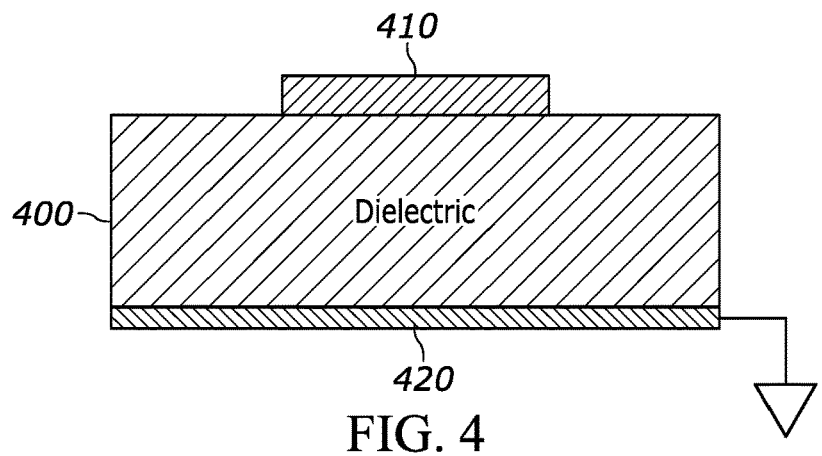
FIG. 4 is a first representative transmission line implementation.
Figure 5:
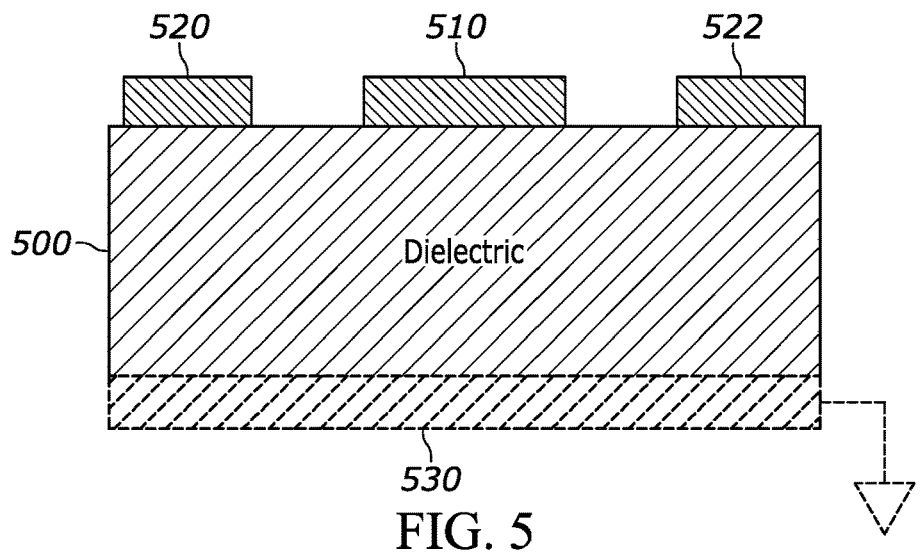
FIG. 5 is a second representative transmission line implementation.
Figure 6:
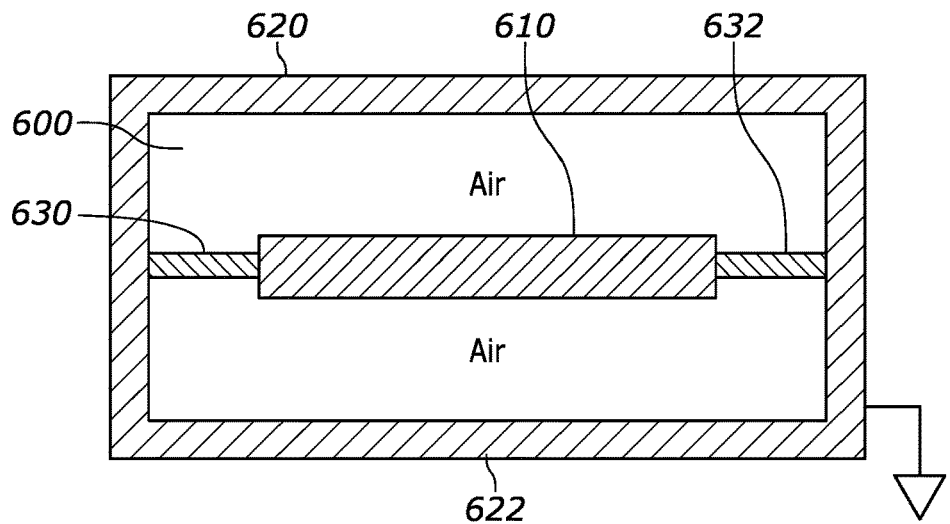
FIG. 6 is a third representative transmission line implementation.

Generally, the distributed-element circuit can be implemented in one of many forms. In one implementation, shown in FIG. 4, a microstrip transmission line comprises a dielectric base 400 separating a distributed-element circuit 410 from a ground plane 420. In another implementation, shown in FIG. 5, a coplanar waveguide (CPW) transmission line comprises a dielectric base 500 supporting a distributed-element circuit 510 flanked by coplanar return conductors 520 and 522, each spaced apart from opposite sides of the distributed-element circuit. The CPW can alternatively comprises a ground plane 530 separated from the distributed-element circuit and return conductors by the dielectric base. In another implementation, shown in FIG. 6, a suspended stripline transmission line comprises a distributed-element circuit 610 suspended between ground planes 620 and 622 by non-conductive support members 630, 632 wherein the dielectric base is an air dielectric between the distributed-element circuit 610 and one or both of the ground planes 622. For suspended stripline implementations, the ground plane 620 can constitute a portion of a housing constituting the electrical component, wherein the electromagnetic field modification member is movably disposed between the ground plane 620 and the distributed-element circuit 610.

The electrical component also comprises a host-interface for integration with a host device. In some implementations, the electrical component is a surface-mount device (SMD) wherein the host-interface is disposed on a surface or side of the dielectric base opposite the distributed-element circuit. Such an interface can comprise a ground plane or conductive pads alone or in combination with the ground plane. FIG. 1 shows the electrical component 100 embodied as a SMD mounted on a host-device substrate 150. The host-interface can also comprise external contacts electrically coupled to the distributed-element circuit, wherein the distributed-element circuit is electrically coupled to electrical contacts of the host-interface. The external contacts can be surface mount contacts or wire bond contacts located on some other portion of the component. In FIG. 1, external contacts 114, 116 are electrically coupled to the distributed-element circuit and disposed on an exterior portion of the component 100. Alternatively, the component can be a through-hole device having leads that extend through apertures in a host device and electrically contact traces thereon.

Figure 7:
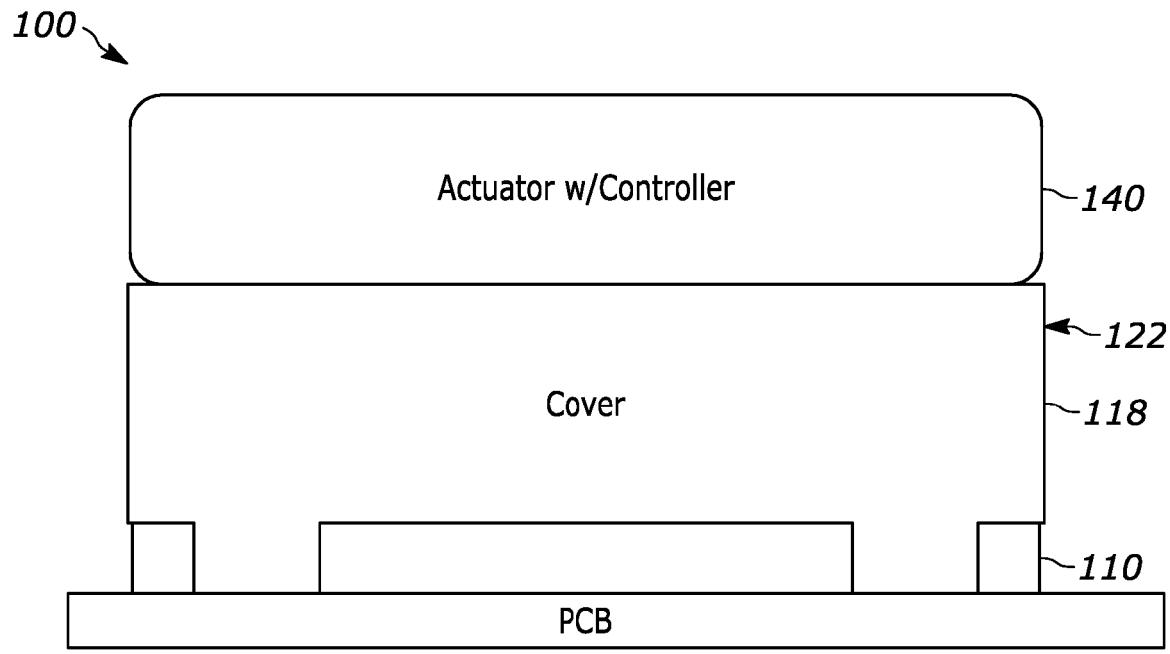
FIG. 7 is an external view of the electrical component of FIG. 1.
Figure 8:
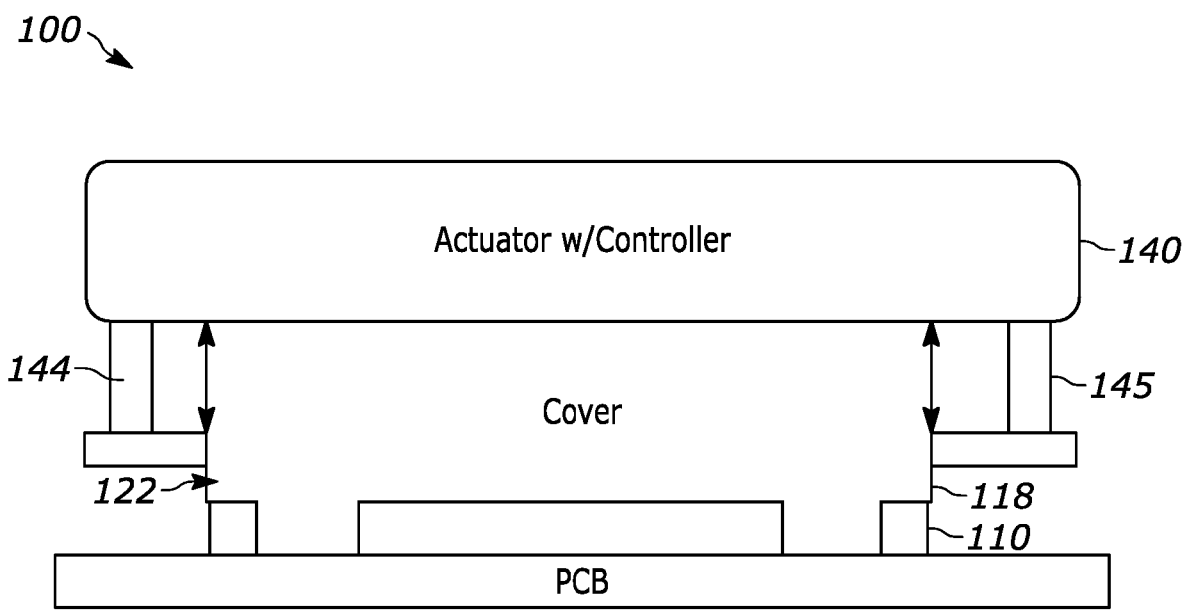
FIG. 8 is an external side view of an alternative electrical component.

In some implementations, the electrical component comprises an electromagnetic shield enclosing the air gap between the distributed-element circuit and the electromagnetic field modification member. In FIGS. 1, 7 & 8, the component 100 comprises a sidewall portion 118 fabricated from an electrically conductive material for electromagnetic shielding purposes. The sidewall portion can be an integral part of an enclosed cup-shaped cover portion 122 fastened to the dielectric base. Alternatively, the cover 122 can be an enclosed sidewall with open ends fastened to the dielectric base. The sidewall or cover can be a stamped or drawn metal, like copper. The sidewall or cover can also be a molded plastic or polymer, all or portions of which can be conductive or covered by a conductive coating. In implementations that include a ground plane disposed on the dielectric base, the electromagnetic shield can be electrically coupled to the ground plane. The electromagnetic shield can protect the electrical component from interference from external sources and prevent interference of devices external to the electrical component. In other implementations, the electrical component does not include an electromagnetic shield covering the air gap. In these implementations the sidewall 118 or housing 122 can be non-conductive.

The actuator generally comprises one or more movable members coupled to the electromagnetic field modification member. The actuator can take a variety of forms. In FIG. 1, the actuator is a linear actuator comprising a movable member 142 coupled to the field modification member, wherein at least a portion of the movable member and field modification member are disposed within the housing 122 of the electrical component. In FIG. 8, the linear actuator comprises movable members 144, 145 coupled to portions of the electromagnetic field modification member extending through the housing and located outside the housing. In other implementations the actuator is non-linear. In one implementation, the actuator comprises a closed-loop controller coupled to a motor that drives the electromagnetic field modification member. The movable member can be a part of a motor or driven by a motor. For example, the motor can be a stepper motor that turns a precision jackscrew coupled to the field modification member.

In FIG. 1, the actuator 140 is mounted on an end surface of the housing 122 and the movable member 130 extends through an opening in the housing. Alternatively, the actuator can be fastened to an open-ended portion of a sidewall. Thus configured linear actuation of the movable member can position the electromagnetic field modification member 120 toward or away from the distributed-element circuit on the surface 112 of the dielectric base 110. In some implementations, the electromagnetic shield modification member can be guided by an inner surface or by other structural features if the movable member is insufficiently rigid for that purpose.

Figure 9:
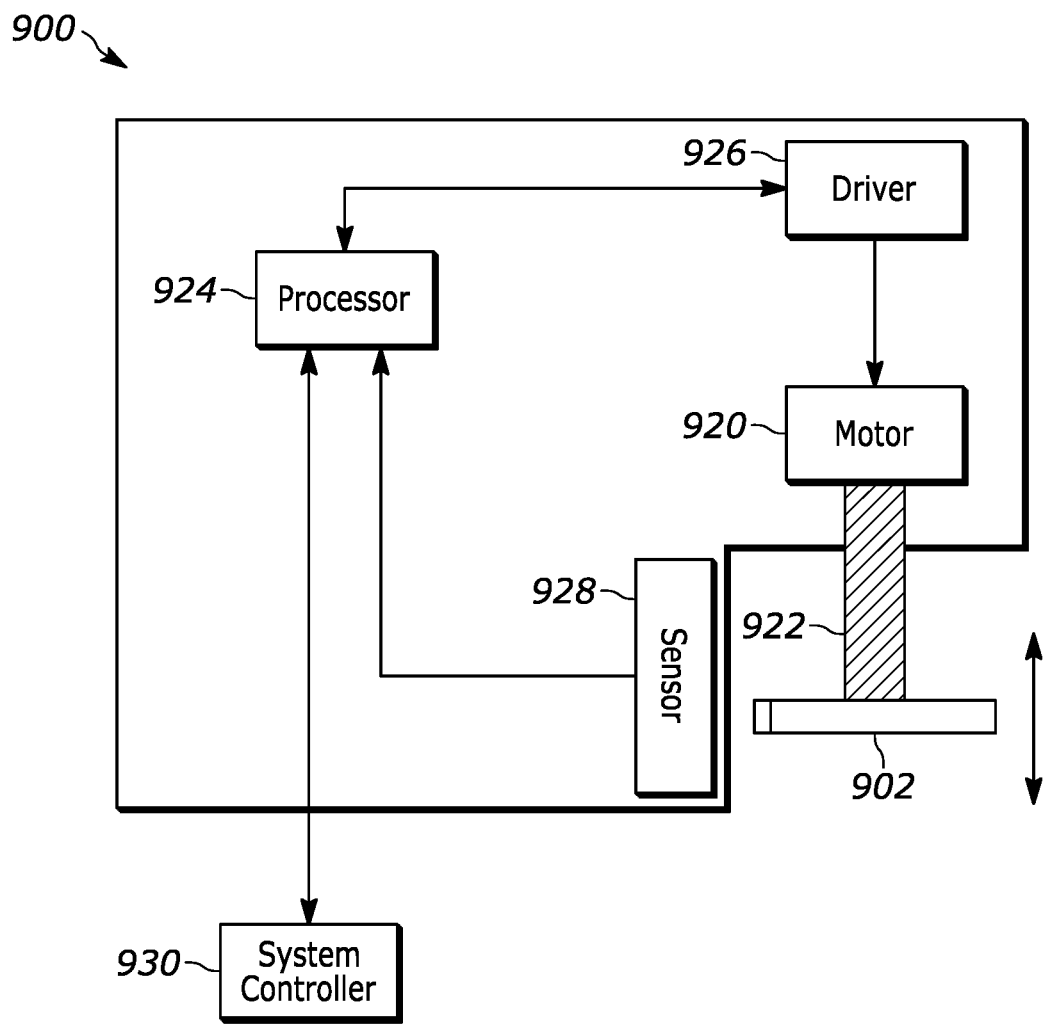
FIG. 9 is a schematic diagram of a micro-linear actuator.

In FIG. 9, a representative linear actuator comprises a motor 920 having a movable member 922 connectable to the electromagnetic field modification member 902. The motor can be a piezo micro-motor, a stepper-motor, or some other precision motor configured to drive the movable member. The actuator also comprises a closed-loop control system comprising a processor 924 that controls a driver circuit 926 coupled to the motor. A position sensor 928 detects and feeds back the position of the field modification member to the processor for accurate positioning. The position sensor can be an encoder that converts a position determination into an electrical signal. A linear encoder can be used to track linear displacement of the field modification member. Alternatively, a rotary encoder can track rotational displacement of the movable member like a jackscrew or of a non-linear actuator. The actuator can be integrated with a system controller 930 or be self-contained. Suitable actuators include the a low cost, low power, small size M3-L Linear Actuator from New Scale Technologies, Victor, N.Y.

The center frequency of an adjustable electrical component can be tuned by changing the air gap between the distributed-element filter circuit and an electromagnetic field modification member devoid of a ground plane. Generally, the center frequency of the filter component decreases with decreasing separation between the distributed-element circuit and the electromagnetic field modification member.

Figure 10:
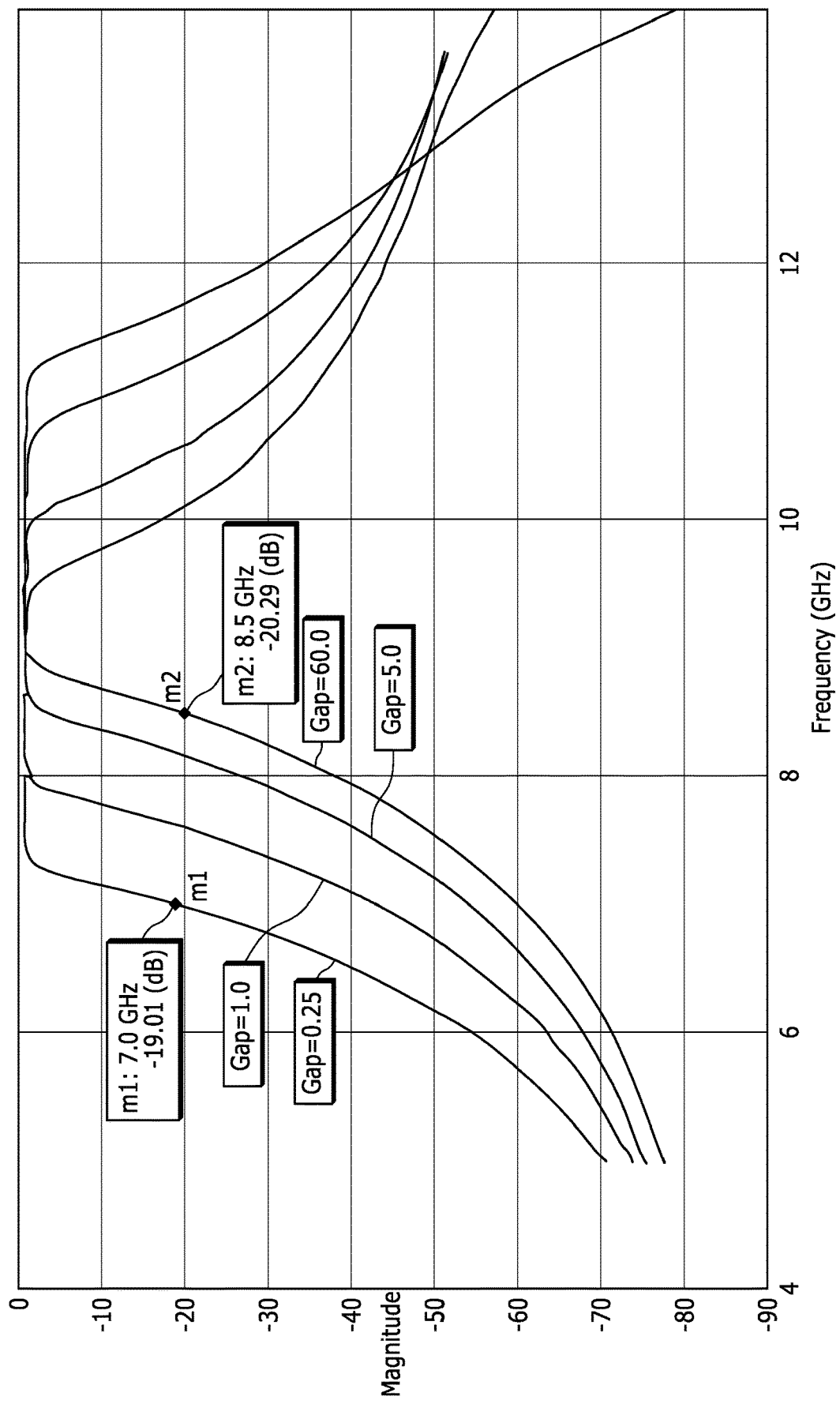
FIG. 10 shows representative frequency variation for an adjustable filter component.

FIG. 10 shows simulated center frequency variation for various gaps (e.g., 0.25 mm, 1 mm, 5 mm and 60 mm) between the distributed-element circuit and an electromagnetic field modification member. Thus the center frequency of a filter, resonator or other electrical component described herein can be tuned accordingly.

Figure 11:
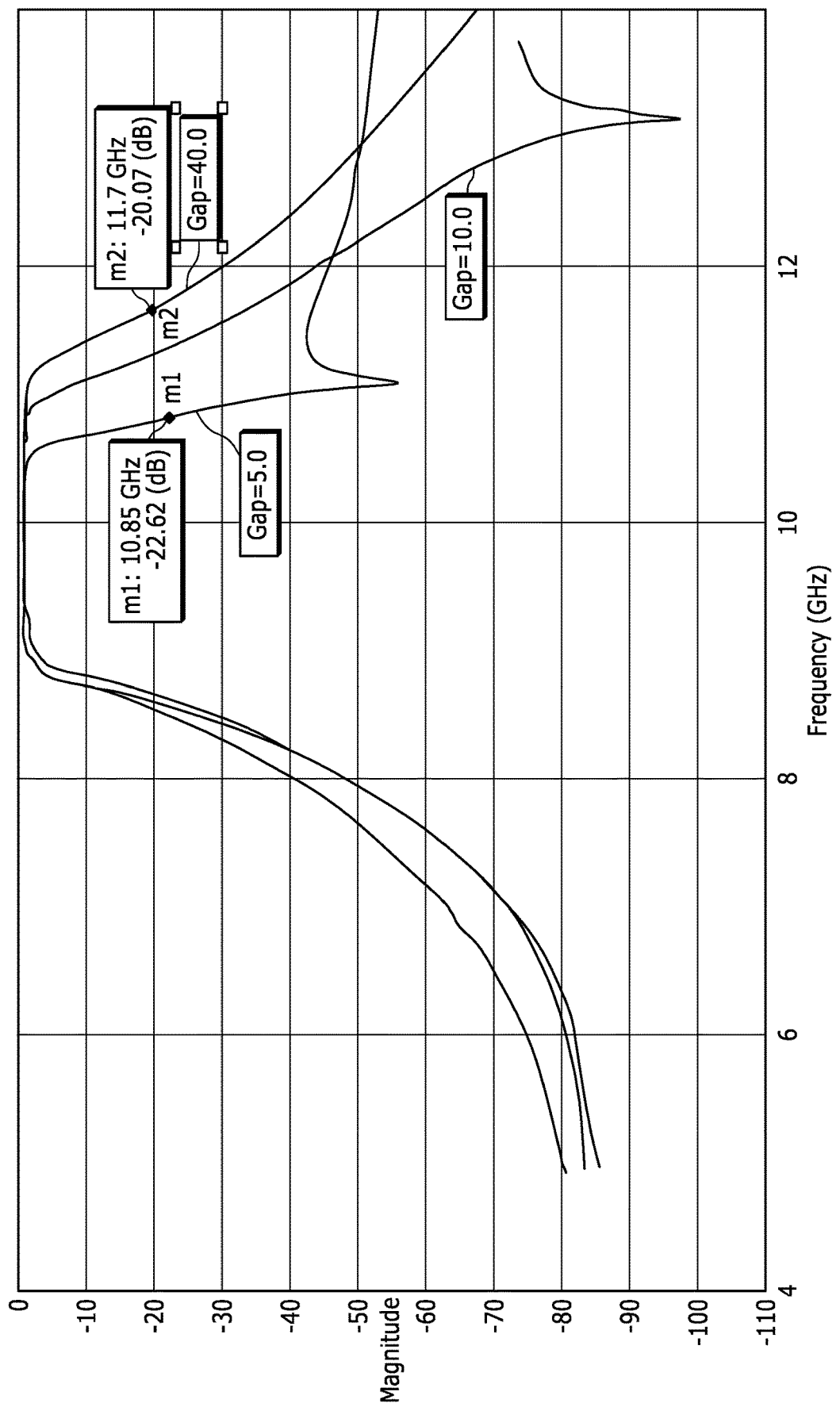
FIG. 11 shows representative bandwidth variation for an adjustable filter component.

Similarly, the bandwidth of the frequency response of an adjustable electrical component can be tuned by changing the air gap between the distributed-element filter circuit and an electromagnetic field modification member comprising a ground plane. Such a ground plane can be located on a surface of a dielectric facing the distributed-element circuit or on a surface of the dielectric opposite the filter circuit. Generally, the frequency bandwidth of the electrical component decreases with decreasing separation between the distributed-element circuit and the electromagnetic field modification member. FIG. 11 shows simulated bandwidth variation for various gaps (e.g., 5 mm, 10 mm and 40 mm) between the distributed-element circuit and an electromagnetic field modification member. Thus the center bandwidth of a filter, resonator or other electrical component described herein can be tuned accordingly.

While the disclosure and what is presently considered to be the best mode thereof has been described in a manner establishing possession and enabling those of ordinary skill in the art to make and use the same, it will be understood and appreciated that there are equivalents to the select embodiments described herein and that myriad modifications and variations may be made thereto without departing from the scope and spirit of the invention, which is to be limited not by the embodiments described but by the appended claims and their equivalents.

What is claimed is:

1. A surface-mount filter component comprising:
   a housing including a dielectric base and a cover;
   a host-interface disposed on the housing;
   a conductive distributed-element circuit disposed on a surface of the dielectric base, the distributed-element circuit electrically coupled to electrical contacts of the host-interface;
   an electromagnetic field modification member movably disposed in the housing and separated from the distributed-element circuit by an air gap;
   an actuator coupled to the housing and including a movable member coupled to the electromagnetic field modification member,
   wherein a frequency characteristic of the filter component is tunable by positioning the electromagnetic field modification member relative to the distributed-element circuit.

2. The filter component of claim 1 further comprising a ground plane, wherein the dielectric base separates the ground plane and the distributed-element circuit.

3. The filter component of claim 2 further comprising an electromagnetic shield coupled to the ground plane and enclosing the air gap between the distributed-element circuit and the electromagnetic field modification member.

4. The filter component of claim 2, the electromagnetic field modification member is electrically coupled to the ground plane, wherein movement of the electromagnetic field modification member relative to the distributed-element circuit changes a bandwidth of the frequency characteristic.

5. The filter component of claim 1, wherein the host-interface is coupled to the dielectric base.

6. The filter component of claim 5, wherein the host-interface comprises wire-bond contacts disposed on the housing.

7. The filter component of claim 1, wherein the actuator is a linear actuator.

8. The filter component of claim 1, wherein the movable member is part of a motor and the actuator comprises a closed-loop controller coupled to the motor and to a position sensor located adjacent the electromagnetic field modification member.

9. The filter component of claim 1, the electromagnetic field modification member comprises a dielectric, wherein movement of the electromagnetic field modification member relative to the distributed-element circuit changes a center frequency of the frequency response characteristic.

10. A electrical component comprising:
    a dielectric base;
    a host-interface;
    a conductive distributed-element circuit supported on a surface the dielectric base, the distributed-element circuit electrically coupled to the host-interface;
    an electromagnetic field modification member separated from the distributed-element circuit by a gap have a dielectric different than the dielectric base;
    an actuator including a movable member coupled to the electromagnetic field modification member,
    wherein the electromagnetic field modification member is positionable relative to the distributed-element circuit upon actuation of the movable member.

11. The electrical component of claim 10 further comprising a ground plane, wherein the dielectric base separates the ground plane and the distributed-element circuit.

12. The electrical component of claim 11 is a resonator.

13. The electrical component of claim 11, wherein the host-interface comprises the ground plane disposed on the dielectric base.

14. The electrical component of claim 13, wherein the host-interface comprises wire bond contacts disposed on an exterior of the electrical component.

15. The electrical component of claim 10, wherein the movable member is driven by a motor and the actuator comprises a closed-loop controller coupled to the motor and to a sensor located to detect a position of the electromagnetic field modification member.

16. The electrical component of claim 10, wherein the actuator is a linear actuator.

17. The filter component of claim 10 further comprising an electromagnetic shield enclosing the air gap between the distributed-element circuit and the electromagnetic field modification member.

18. A surface-mount electrical component comprising:
    a housing including a dielectric base and a cover;
    a host-interface;
    a conductive distributed-element circuit disposed on a surface the dielectric base, the distributed-element circuit electrically coupled to electrical contacts of the host-interface;
    an electromagnetic field modification member movably disposed in the housing and separated from the distributed-element circuit by an air gap;
    an actuator including a movable member coupled to the electromagnetic field modification member, the electromagnetic field modification member positionable in the air gap relative to the distributed-element circuit;
    an electromagnetic shield extending between the dielectric base and the electromagnetic field modification member and enclosing the air gap.

19. The electrical component of claim 18, the electromagnetic field modification member comprises a dielectric, wherein movement of the electromagnetic field modification member relative to the distributed-element circuit changes a characteristic of the electrical component.

20. The electrical component of claim 19, wherein the movable member is part of a motor and the actuator comprises a closed-loop controller coupled to the motor and to a position sensor located adjacent the electromagnetic field modification member.

* * * * *